US006126988A

United States Patent [19]

Drumm

[11] Patent Number: 6,126,988

[45] Date of Patent: Oct. 3, 2000

[54] METHOD FOR CREATING A PLANAR ALUMINUM LAYER IN A FLAT PANEL DISPLAY STRUCTURE

[75] Inventor: Paul M. Drumm, San Jose, Calif.

[73] Assignee: Candescent Technologies Corporation, San Jose, Calif.

[21] Appl. No.: 08/808,336

[22] Filed: Feb. 28, 1997

[51] Int. Cl.[7] .............................. B05D 5/00; C23C 14/02; C23C 14/16; H04N 9/00

[52] U.S. Cl. .............................. 427/64; 427/68; 427/404; 427/301; 427/304; 427/69; 427/70; 427/123; 427/124; 427/125; 427/372.2; 427/383.1; 427/384; 430/23; 430/25; 430/26

[58] Field of Search ..................................... 313/422, 495, 313/543, 503, 473; 427/64, 123, 124, 125, 302, 301, 303, 304, 331, 384, 320, 69, 372.2, 70, 383.1, 68, 404; 310/154; 216/25; 428/656, 458, 690, 457, 670, 652, 424, 626, 650, 220, 687, 668, 704, 463, 461; 345/55, 75; 430/311, 313, 315, 23, 320, 25, 26; 205/210, 164; 250/581, 484.4

[56] References Cited

U.S. PATENT DOCUMENTS

| | | | |
|---|---|---|---|
| 3,635,761 | 1/1972 | Haag et al. | 117/227 |
| 5,477,105 | 12/1995 | Curtin et al. | 313/422 |
| 5,547,411 | 8/1996 | Lee | 445/52 |
| 5,587,201 | 12/1996 | Rho et al. | 427/64 |
| 5,717,032 | 2/1998 | Kim et al. | 525/165 |
| 5,725,787 | 3/1998 | Curtin et al. | 216/25 |

*Primary Examiner*—Archene Turner
*Assistant Examiner*—Michael LaVilla
*Attorney, Agent, or Firm*—Wagner, Murabito & Hao LLP

[57] ABSTRACT

A method for forming a planar aluminum layer in a flat panel display structure. In one embodiment, the present invention creates a flat panel display structure having a raised black matrix defining wells within the matrix. The present embodiment then deposits a non-conformal layer of acrylic-containing aluminizing lacquer over a layer of phosphors residing within the wells of the black matrix. In so doing, the lacquer layer forms a substantially planar surface on top of the phosphors. The present invention then deposits a layer of catalyst material over the layer of lacquer so that the aluminizing lacquer can be burned off completely and cleanly at a relatively low temperature. The catalytic layer conforms to the planar surface of the lacquer layer. The present invention then deposits an aluminum layer over the catalytic layer. The aluminum layer, in turn, conforms to the planar surface of the catalytic layer. Finally, the present invention bakes off the non-conformal lacquer layer. The baking process is conducted at a temperature such that the lacquer layer is cleanly and completely oxidized. This temperature is relatively low so as not to adversely affect the reflectivity of the aluminum layer, damage the black matrix material, or induce oxidation of phosphors. After the baking process, the present invention achieves a substantially planar and mirror-like aluminum surface.

22 Claims, 6 Drawing Sheets

METHOD FOR CREATING A PLANAR ALUMINUM LAYER IN A FLAT PANEL DISPLAY STRUCTURE

TECHNICAL FIELD

The present claimed invention relates to the field of flat panel displays. More specifically, the present claimed invention relates to the fabrication of a planar aluminum layer onto a black matrix of a flat panel display screen structure.

BACKGROUND ART

Aluminum layers are used in flat panel display screens to reflect photons back to the viewer. In conventional flat panel display devices, a black border or "black matrix" has also been used to achieve improved display characteristics. Typically, the black matrix is formed on the inside of the viewing screen panel opposite the viewing side of the screen and is comprised of organic materials.

The black matrix is comprised of raised borders, which surround and define a plurality of wells. In a typical flat panel display, phosphors are deposited into these wells. The phosphors give off light when bombarded by electrons. These phosphors convert the electron energy into visible light to form an image on the viewing screen. Each well contains a color "sub-pixel" of red, blue, or green light-emitting phosphors. By segregating color sub-pixels, the black matrix increases the contrast of the display by keeping the colors cleanly separated.

As stated above, light is generated by phosphors when beams of electrons excite the phosphors disposed in the wells of the black matrix. Light generated in this manner is emitted in the direction of the viewing screen to be seen by the viewer. However, some light is emitted in the opposite direction away from the viewing screen. To redirect or reflect this light towards the viewing screen, an aluminum layer is disposed on top of the phosphor layer. Unfortunately, conventional aluminum layers have several shortcomings associated therewith. These shortcomings originate from limitations in fabrication processes and temperature limitations of materials associated with aluminum layer creation steps. Schematic side sectional views depicting conventional steps used in fabricating an aluminum layer are shown in Prior Art FIGS. 1A through 1F.

With reference to Prior Art FIG. 1A, a side sectional view of a raised black matrix 100 having orthogonally arranged portions 102 and 104 is shown. Black matrix 100 is disposed on the interior surface of a viewing screen. As shown in Prior Art FIG. 1A, orthogonally arranged portions 102 and 104 of black matrix 100 define wells there between.

Referring now to Prior Art FIG. 1B, phosphors, typically shown as 106, are deposited into the wells defined by orthogonally arranged portions 102 and 104 of black matrix 100.

Next, referring to Prior Art FIG. 1C, a lacquer layer 108 is deposited on top of phosphors 106. Lacquer layer 108 is used to form a relatively flat surface on top of phosphors 106. However as shown in FIG. 1C, lacquer layer 108 is conformal. As a result, lacquer layer 108 is non-planar. That is, lacquer layer 108 has a surface topography which very closely resembles the surface shape of phosphors 106 residing directly beneath lacquer layer 108.

As shown in Prior Art FIG. 1D, an aluminum layer 110 is then deposited on top of lacquer layer 108. As with conformal lacquer layer 108, aluminum layer 110 conforms to the shape of the underlying topography. As a result, aluminum layer 110 has substantially the same shape as lacquer layer 108, and the surface shape of underlying phosphors 106. Thus, aluminum layer 110 has a substantially non-planar topography.

In reference to Prior Art FIG. 1E, aluminum layer 110 is shown after baking off lacquer layer 108. Lacquer layer 108 has been evaporated through tiny pores in aluminum layer 110, leaving only aluminum layer 110 disposed on top of phosphors 106. Even after the baking out process, the surface of aluminum layer 110 remains non-planar. That is, the surface of aluminum layer 110 still conforms to the shape of the surface of phosphors 106.

Prior Art FIG. 1F depicts several paths of light 112 generated by phosphors 106. As shown in Prior Art FIG. 1F, light 112 is emitted from phosphors 106 in the direction of aluminum layer 110. Due to the non-planar surface of aluminum layer 110, light 112 may scatter in other directions, instead of being redirected or reflected towards the viewing screen. As yet another drawback associated with a non-planar aluminum layer, electrons may be deflected away from the phosphors. As a result, the non-planar aluminum layer acts as a barrier to some of the electrons emitted from electron emitting devices, thereby further reducing the efficiency of the flat panel display. Therefore, the efficiency of the flat panel display is decreased due to the loss of light 112 through aluminum layer 110 and the impedance of electrons by aluminum layer 110.

In one attempt to obtain a planar layer of aluminum, the depth of prior art aluminum layer 110 has been increased. However, such an aluminum layer with an increased thickness can reduce the efficiency of the flat panel displays by preventing electrons from penetrating the thickened aluminum layer. As a result, emitted electrons never reach their intended target, the phosphors. Hence, less light is generated in such thick aluminum layer embodiments.

Additionally, conventional aluminum layer fabrication methods are severely limited by the temperature limitations of black matrix material, aluminum, and phosphors. More specifically, the black matrix is made up of organic materials which cannot withstand temperatures over 380 degrees Celsius. Above this temperature, the black matrix undergoes pyrolysis with resulting damages to its internal organic structure. Hence, prior art bake off processes are limited to 380 degrees Celsius or lower. Such temperature limitation in turn limits the lacquer materials which can be used in the process. That is, acceptable lacquers are limited only to those having relatively light solid contents and/or molecular weight species such as, for example, nitrocellulose. Unfortunately, light solid contents and/or molecular weight species tend to conform to the surface of phosphors. Thus, these lacquers do not produce a smooth planar surface on top of the phosphors.

On the other hand, lacquers containing higher solid content and/or molecular weight species such as acrylics would produce a more smooth planar surface. However, these lacquers do not burn out cleanly at temperatures of 380 degrees Celsius or lower. This temperature limitation has prevented wide use of lacquers with higher solid content and/or molecular weight species.

Furthermore, even if the black matrix or the lacquer layer could tolerate temperatures higher than 380 degrees Celsius, such temperatures would have a deleterious effect on other materials, such as, for example aluminum and phosphors. Under such higher temperatures, unwanted oxidation of the aluminum and phosphors may occur. This oxidation may cause the aluminum layer to lose its characteristic reflectivity. Similarly, phosphors can lose its characteristic efficiency. Therefore, higher temperatures have had an effect of reducing the efficiency of the flat panel display.

Thus, a need exists for a method to create a planar aluminum layer in a flat panel display structure which allows more light reflection toward the viewing screen. A further need exists to achieve the above-mentioned planar aluminum layer in a way which does not induce pyrolysis or otherwise damage a proximately located black matrix. Yet another need exists to achieve the planar aluminum layer without employing processes and/or temperatures which damage aluminum layer and the underlying phosphors, or impede the passage of emitted electrons through the aluminum layer.

SUMMARY OF INVENTION

The present invention provides a method for creating a planar aluminum layer in a flat panel display structure. The present invention further provides a method for creating a planar aluminum layer in a way. which does not induce pyrolysis or otherwise damage proximately located black matrix. Additionally, the present invention achieves the above accomplishments without employing processes and/or temperatures which damage the aluminum layer or the underlying phosphors, or impede the passage of emitted electrons through the aluminum layer.

Specifically, in one embodiment, the present invention creates a flat panel display structure having a raised black matrix defining wells within the matrix. The present embodiment then deposits a non-conformal layer of acrylic-containing aluminizing lacquer over a layer of phosphors residing within the wells of the black matrix. In so doing, the lacquer layer forms a substantially planar surface on top of the phosphors. The present invention then deposits a layer of catalyst material over the layer of lacquer so that the aluminizing lacquer can be burned off completely and cleanly at a relatively low temperature. The catalytic layer conforms to the planar surface of the lacquer layer. The present invention then deposits an aluminum layer over the catalytic layer. The aluminum layer in turn conforms to the planar surface of the catalytic layer. Finally, the present invention bakes off the non-conformal lacquer layer. The baking process is conducted at a temperature such that the lacquer layer is completely oxidized. This temperature is relatively low so as not to adversely affect the reflectivity of the aluminum layer, induce pyrolysis or oxidation of the black matrix material, the aluminum layer, or the phosphors.

After the baking process, the present invention is left with a substantially planar and mirror-like aluminum surface. The planar topography of the aluminum surface, provides more light to the viewing screen by reflecting phosphor emitted light off of its substantially planar and mirror-like surface towards the viewing screen. In addition, the aluminum layer of the present invention can be made thinner than in conventional flat panel display because it is more efficient at a given thickness. As a result, electrons can more easily penetrate the aluminum layer to excite the phosphors to generate light.

Hence, the present invention provides a method for fabricating a planar aluminum layer that increases reflection of light to the viewing screen in a way which does not induce pyrolysis, oxidation, or otherwise damage the black matrix, the aluminum layer, and phosphors, or impede the passage of emitted electrons through the aluminum layer.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

Prior Art

Prior Art

Prior Art

Prior Art

Prior Art

Prior Art

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention comprises a method for fabricating a planar aluminum layer on top of a phosphor layer in a black matrix formed on a flat panel display screen structure.

Figure 1A:
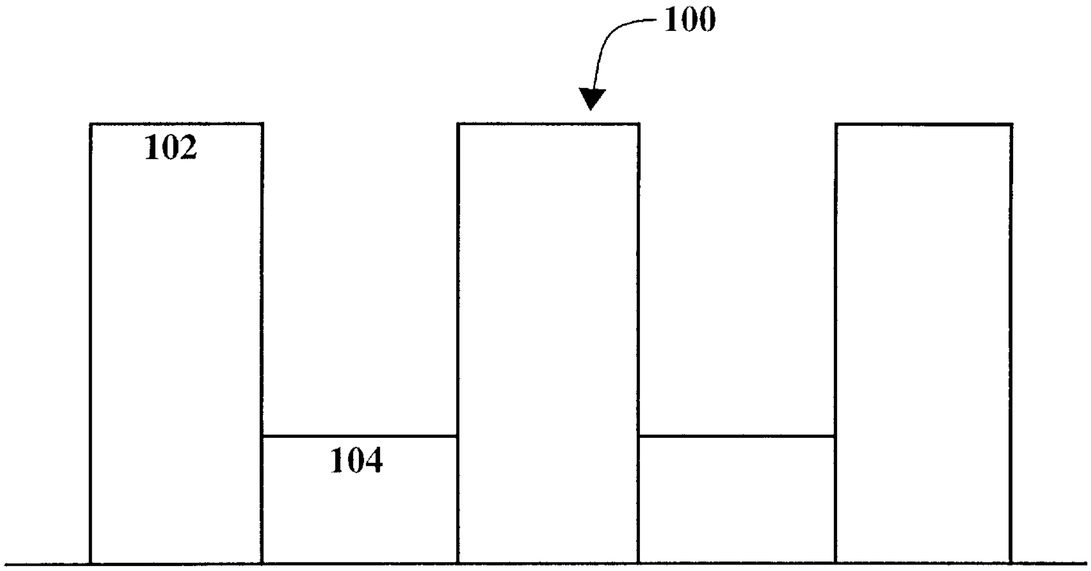
FIG. 1A (Prior Art)
FIG. 1A is a side sectional view of a black matrix having orthogonally disposed borders which define wells.
Figure 1B:
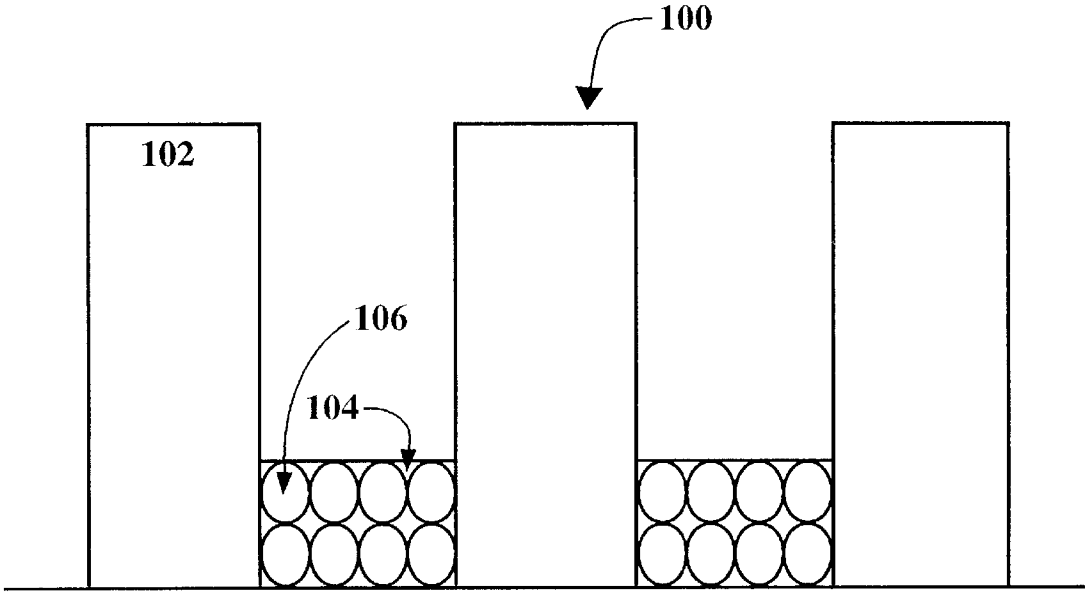
FIG. 1B (Prior Art)
FIG. 1B is a side sectional view illustrating the deposition of phosphors.
Figure 1C:
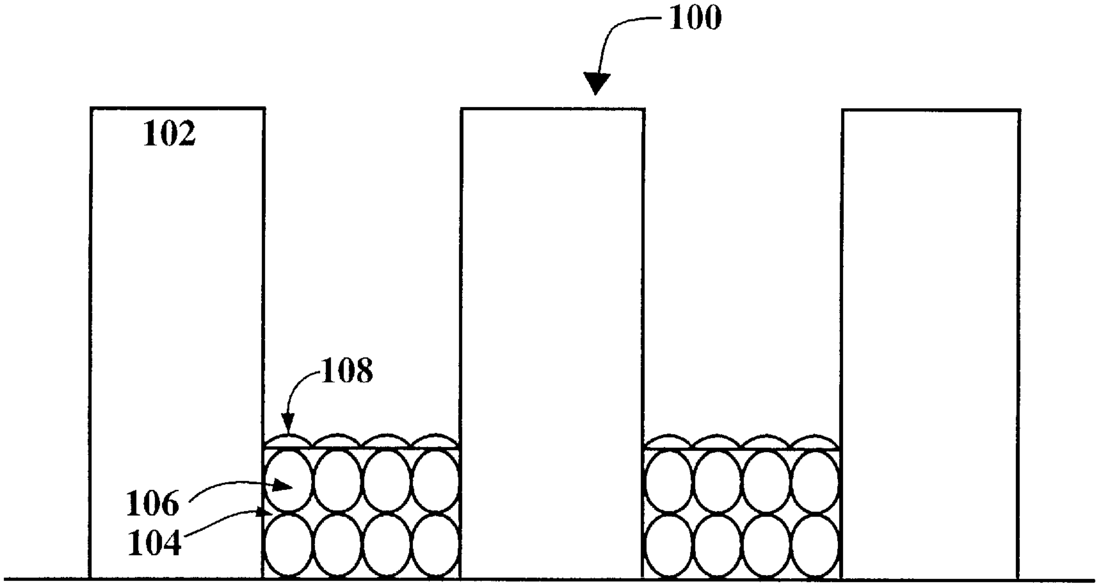
FIG. 1C (Prior Art)
FIG. 1C is a side sectional view illustrating the deposition of a layer of conformal lacquer.
Figure 1D:
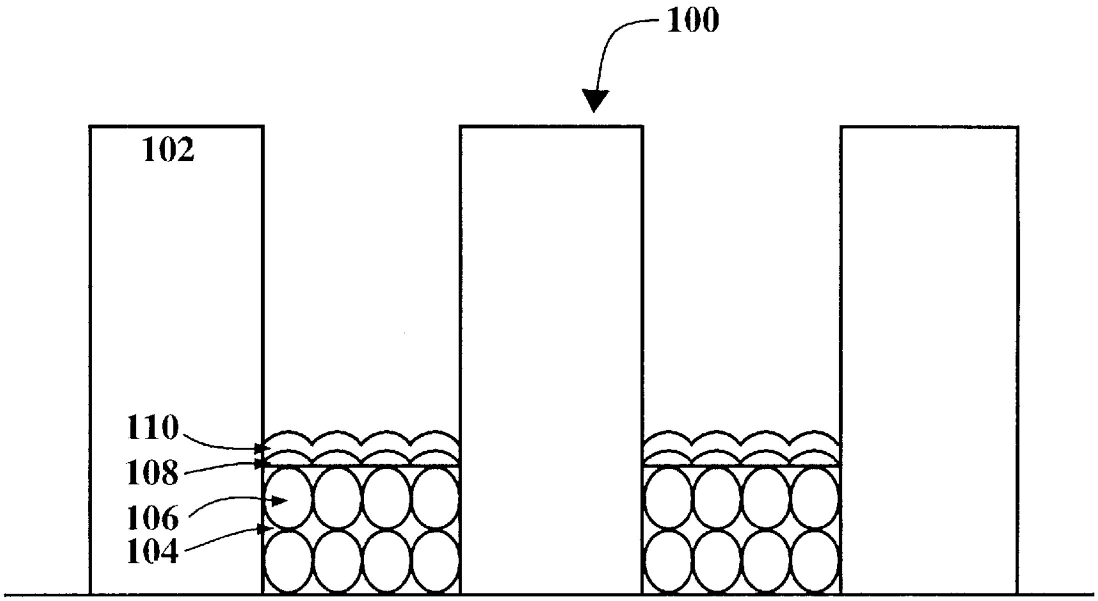
FIG. 1D (Prior Art)
FIG. 1D is a side sectional view illustrating the deposition of an aluminum layer on top of the conformal lacquer layer.
Figure 1E:
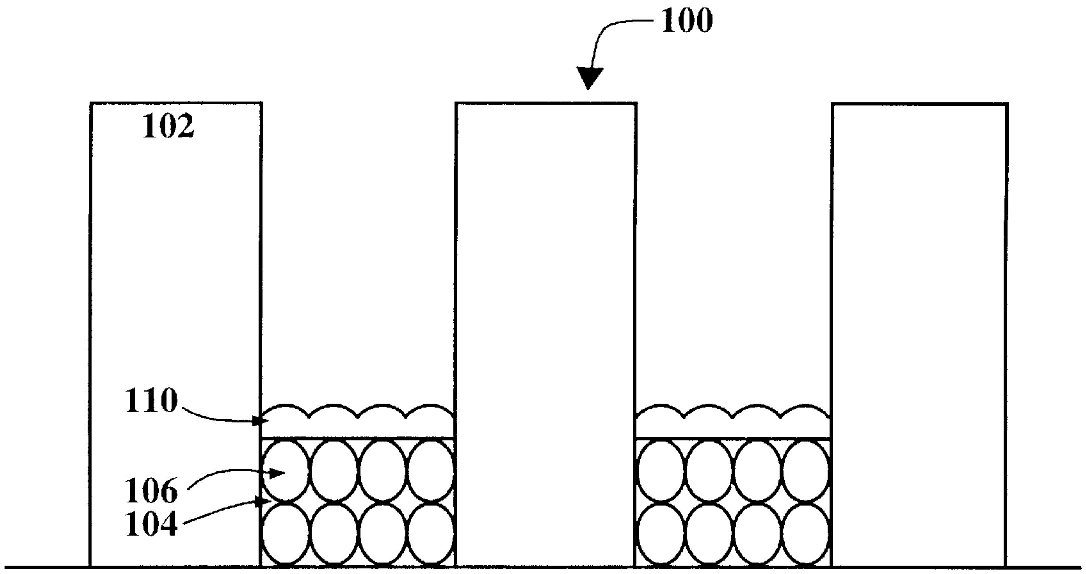
FIG. 1E (Prior Art)
FIG. 1E is a side sectional view illustrating a conventional non-planar aluminum layer.
Figure 1F:
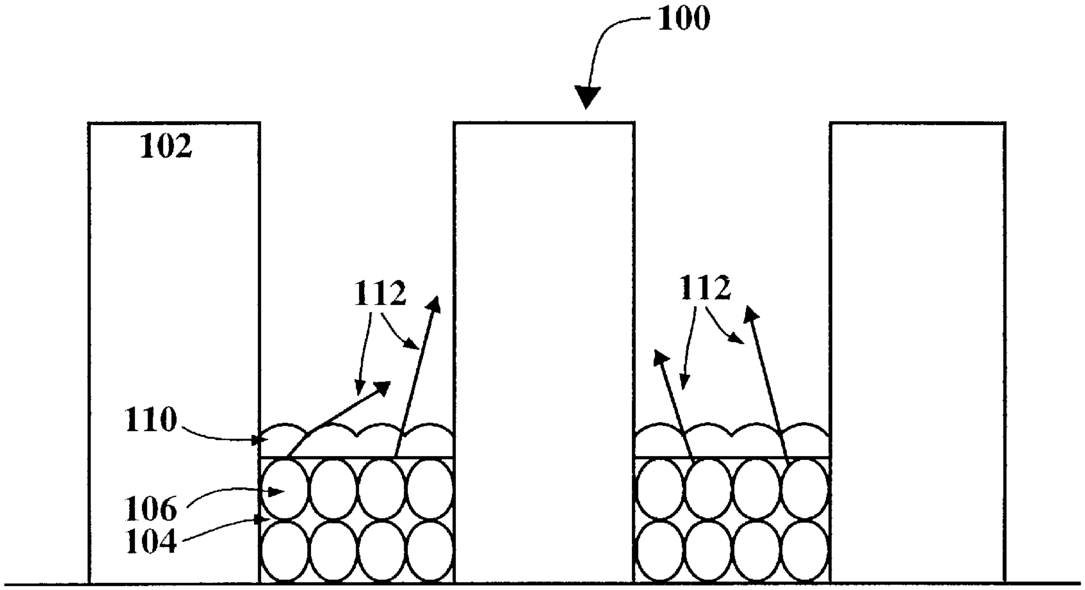
FIG. 1F (Prior Art)
FIG. 1F is a side sectional view illustrating paths of light from phosphors deleteriously passing through the conventional non-planar aluminum layer.
Figure 2A:
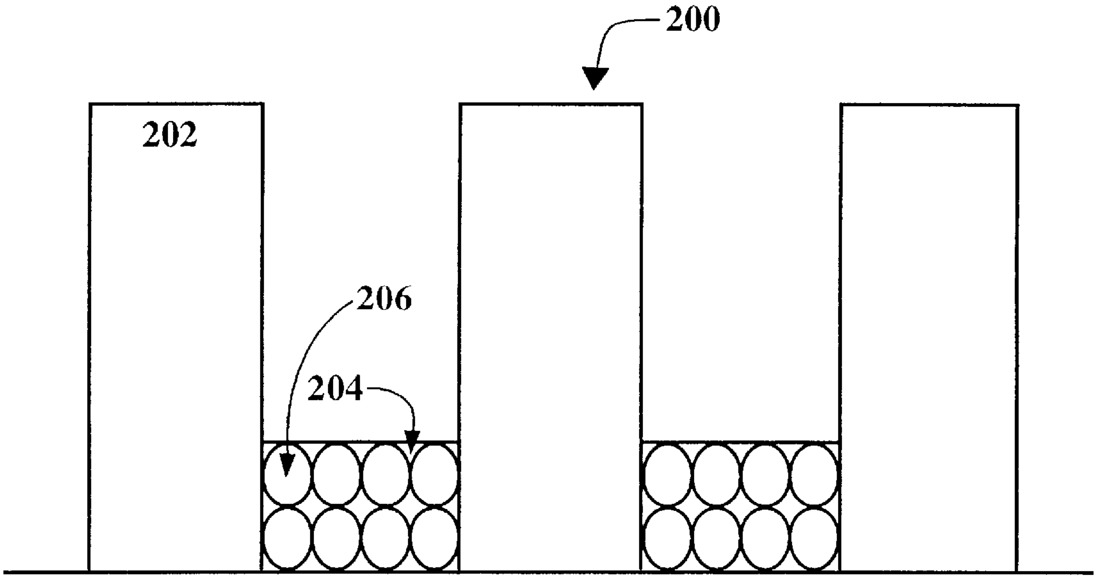
FIG. 2A is a side sectional view illustrating the deposition of phosphors.

Referring to FIG. 2A, a side sectional view of a raised black matrix 200 having orthogonally arranged portions 202 and 204 is shown. Black matrix 200 is disposed on the interior surface of a viewing screen. Orthogonally arranged portions 202 and 204 of black matrix 200 define a plurality of wells there between. FIG. 2A further shows phosphors 206 deposited into the wells defined by orthogonally arranged portions 202 and 204 of black matrix 200.

In the present embodiment each well contains a sub-pixel of red, green, or blue light-emitting phosphors. In the present invention, it is important that orthogonally arranged portions 202 and 204 be taller than the layer of phosphors 206 deposited in the wells. This helps increase the contrast of the screen displays by keeping the colors of sub-pixels cleanly separated. In the present embodiment, orthogonally arranged portions 202 and 204 are typically 50 to 100 microns in height. Even though such heights are used in the present embodiment, the present invention is also well suited to the use of various other heights of orthogonally arranged portions. The layer of phosphors 206 in the present embodiment is approximately 20 microns in depth. Furthermore, in the present embodiment, black matrix 200 is comprised of carbon based organic material.

Figure 2B:
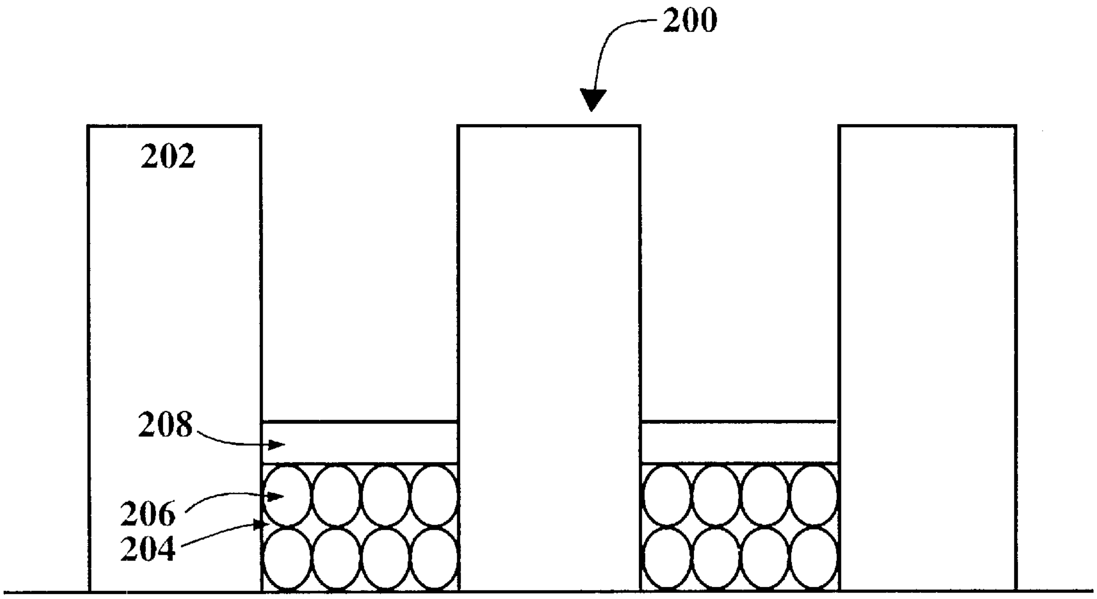
FIG. 2B is a side sectional view illustrating the deposition of a non-conformal aluminizing lacquer layer in accordance with the present claimed invention.

Referring now to FIG. 2B in the present embodiment, a non-conformal lacquer layer 208 is then deposited on top of phosphors 206. In the present embodiment, non-conformal lacquer layer 208 is deposited by spraying lacquer material over phosphors 206. Although such a deposition method is employed in the present embodiment, the present invention is also well suited to depositing non-conformal lacquer layer 208 by various other methods. These methods include, for example, a "floaton" deposition method.

In the present embodiment, non-conformal lacquer layer 208 is comprised of an aluminizing or metallizing lacquer containing high solid content and/or molecular weight species such as acrylics. The high solid content and/or molecular weight characteristics of the acrylic-containing lacquer ensures formation of a surface which is non-conformal with respect to the surface of phosphors 206. As a result, a planar surface is formed above phosphors 206. Although such a lacquer material is used in the present embodiment, the present invention is also well suited for use with various other non-conformal lacquer materials.

Figure 2C:
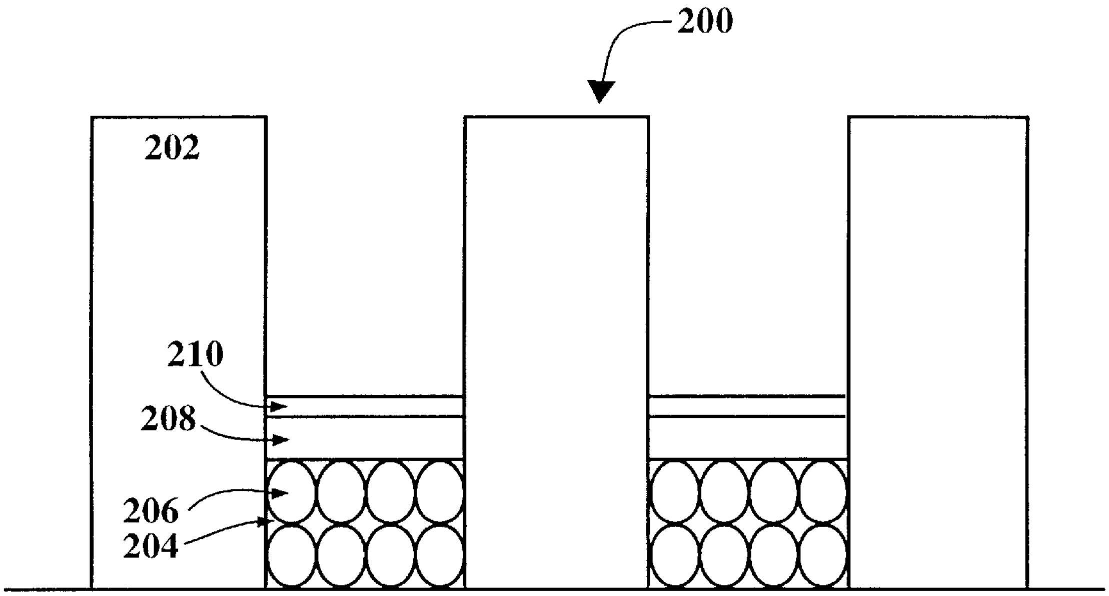
FIG. 2C is a side sectional view illustrating the deposition of a layer of catalyst in accordance with the present claimed invention.

Next, referring to FIG. 2C, a catalytic layer 210 is deposited on top of non-conforming lacquer layer 208. Catalytic layer 210 may be deposited by physical vapor deposition directly onto the non-conforming lacquer layer. Although such a deposition method is used in the present embodiment, the present invention is also well suited for use with various other deposition methods. In the present embodiment, catalytic layer 210 is comprised of Platinum. Although such a catalyst material is employed in the present embodiment, the present invention is also well suited for use with other catalyst materials such as Palladium, Rhodium, and Ruthenium. The depth of catalytic layer 210 is approximately 5 to 40 angstroms. Although such a deposition depth is employed in the present embodiment, the present invention is also well suited to the use of various other deposition depths of catalytic layer 210.

As illustrated in FIG. 2C, catalytic layer 210 conforms to the planar shape of the underlying surface of non-conforming lacquer layer 208. Catalytic layer 210 facilitates a clean and complete oxidation of acrylic-containing non-conformal lacquer layer 208 during bake off.

An advantage of present invention is in achieving a bake off temperature that does not damage the black matrix, the aluminum layer, or the phosphors. The principal factor that limited the bake off temperature in prior art processes was the black matrix. That is, the black matrix could not withstand temperatures over 380 degrees Celsius without undergoing pyrolysis. Hence, conventional processes were limited to using conformal lacquers that could burn off at or below 380 degrees Celsius to prevent pyrolysis and degradation of black matrix. Furthermore, at temperatures above 380 degrees Celsius, the aluminum layer and phosphors were susceptible to oxidation. The aluminum layer, in particular, could lose its characteristic reflectivity. The phosphors could lose their characteristic efficiency. To avoid these detrimental effects arising from the temperature constraint, conventional methods were limited to using conformal lacquer materials containing only nitrocellulose.

Figure 2D:
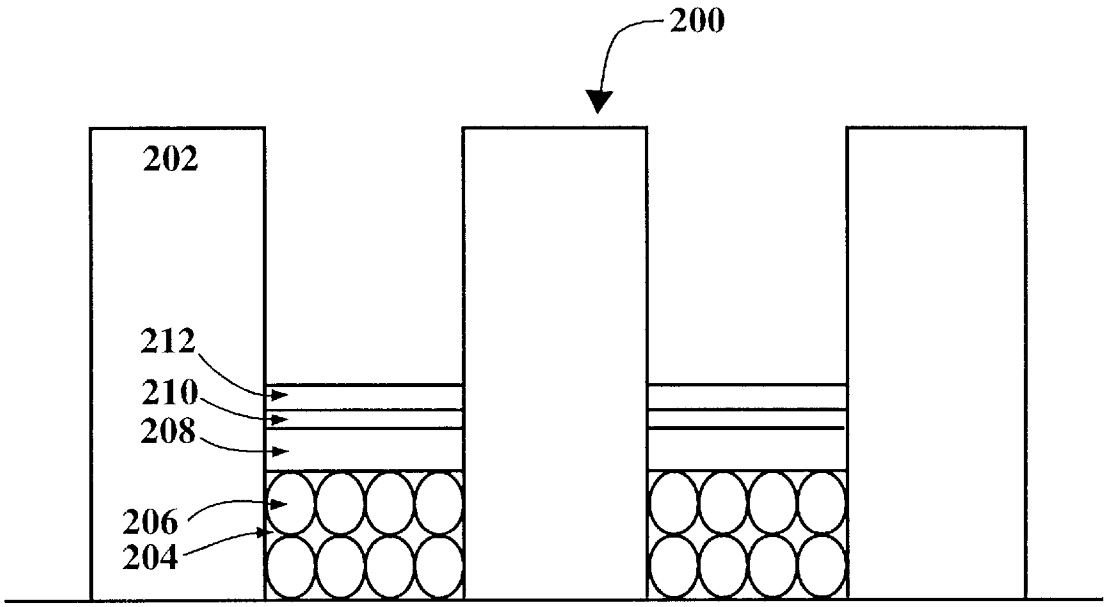
FIG. 2D is a side sectional view illustrating the deposition of an aluminum layer in accordance with the present claimed invention.

As shown in FIG. 2D, an aluminum layer 212 is then deposited on top of catalyst layer 210. In the present embodiment, the depth of aluminum layer 212 deposited is approximately 300 to 800 angstroms. Although such a deposition depth is used in the present embodiment, the present invention is also well suited to the use of various other deposition depths of aluminum layer 212. Like underlying catalyst layer 210, aluminum layer 212 conforms to the planar surface topography of lacquer layer 208. Hence, aluminum layer 208 forms a smooth and planar surface.

After depositing aluminum layer 212, lacquer layer 208 is baked off. Lacquer layer 208 oxides and the gases evaporate through the pores of aluminum layer 212. The entire evaporation process takes place at a temperature that does not damage aluminum layer 212, black matrix 200, or phosphors 206. In the present embodiment, the temperature of the bake off process does not exceed 380 degrees Celsius. Although such a temperature is used in the present embodiment, the present invention is also well suited to the use of various other bake off temperatures which would not damage aluminum layer 212, black matrix 200, or phosphors 206.

Figure 2E:
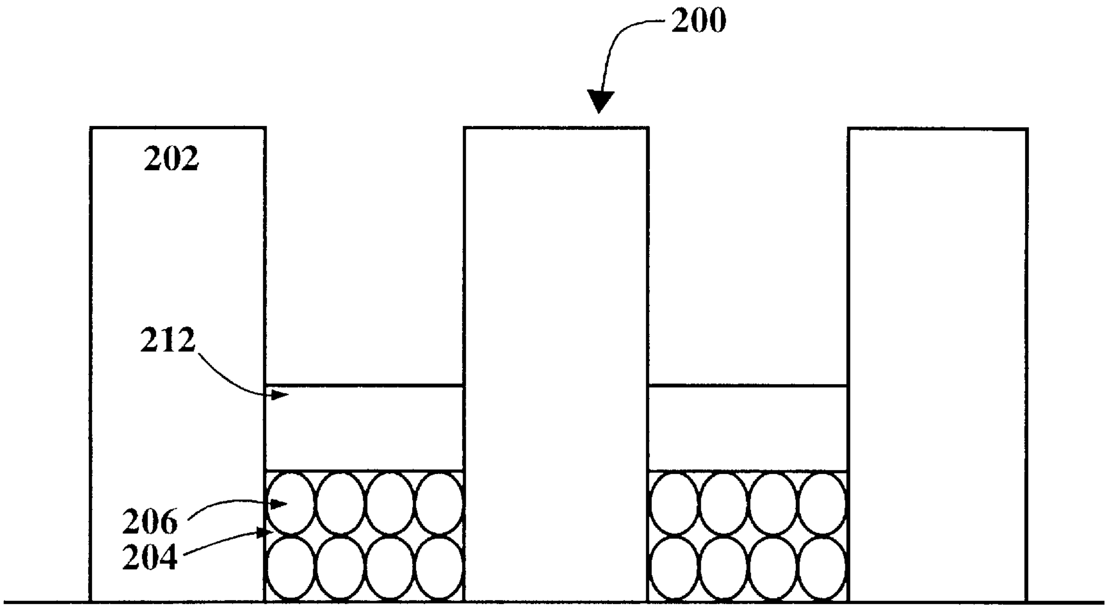
FIG. 2E is a side sectional view illustrating the formation of a planar aluminum layer in accordance with the present claimed invention.

FIG. 2E illustrates remaining aluminum layer 212 after baking off lacquer layer 208 and catalytic layer 210. Only aluminum layer 212 is left disposed on top of phosphors after lacquer layer 208 and catalytic layer 210 are baked off. As shown in FIG. 2E, aluminum layer 212 forms a smooth planar surface over phosphors 206. Hence, the present embodiment avoids the detrimental effect of high bake off temperatures. This is accomplished by utilizing catalytic layer 210 to achieve a bake off temperature which does not cause pyrolysis or oxidation of black matrix 200, aluminum layer 212, or phosphors 206. In the present embodiment, the bake off temperature is less than approximately 380 degrees Celsius.

Figure 2F:
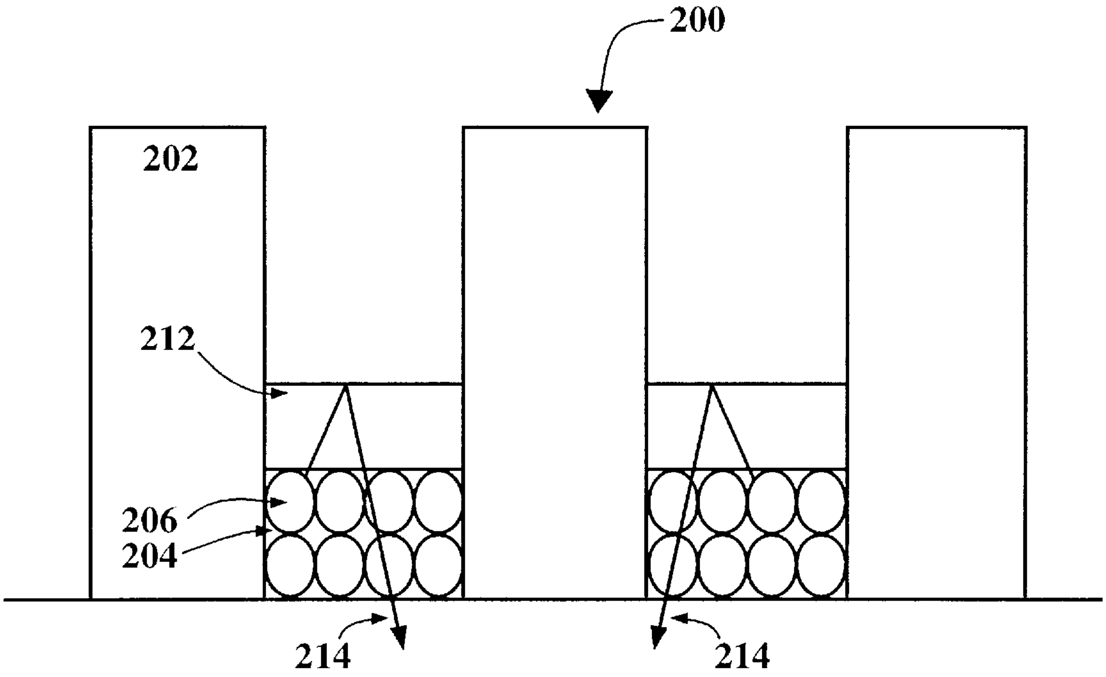
FIG. 2F is a side sectional view illustrating paths of light from phosphors being redirected and reflected towards the viewing screen in accordance with the present claimed invention.

Another advantage of the present invention is illustrated in FIG. 2F which depicts several paths of light 214 generated by phosphors 206. As shown in FIG. 2F, light 214 is emitted from phosphors 206 in the direction of aluminum layer 212. Unlike prior art aluminum layers, however, due to the planar topography of aluminum layer 212, light 214 reflects off aluminum layer 212 and is directed towards the viewing screen. As a result, planar aluminum layer 212 of the present invention increases the transmission efficiency of the flat panel display. Therefore, planar aluminum layer 212 produces brighter screen displays for viewers to enjoy.

As a further benefit, a planar aluminum layer is more efficient than prior art non-planar aluminum layers for a given thickness. In many prior art processes, aluminum layers were made thicker to compensate for the nonplanar topography of the aluminum layer. A thick aluminum layer reduces generation of light by the phosphors by impeding penetration of some electrons through the aluminum layer to the phosphors. On the other hand, a thinner aluminum layer increases the efficiency of a flat panel display screen by allowing more electrons to reach their intended target, phosphors 206, to generate light. Thus, according to present invention, a substantially planar and relatively thin aluminum layer can be readily achieved.

Therefore, the present invention provides a method for fabricating a planar aluminum layer that increases reflection of light to the viewing screen in a way which does not damage or otherwise induce pyrolysis or oxidation of the black matrix, aluminum layer, and phosphors, or impede the passage of emitted electrons through the aluminum layer.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for fabricating a substantially planar aluminum layer in a flat panel display structure having a raised black matrix defining a plurality of wells containing phosphors therein, said method comprising the steps of:

a) depositing a non-conformal layer of lacquer over said phosphors in said wells of said raised black matrix of said flat panel display structure;

b) depositing a catalytic layer over said non-conformal layer of lacquer;

c) depositing an aluminum layer over said catalytic layer, said raised black matrix formed having a height such that a top surface of said raised black matrix extends above the top surface of said aluminum layer; and d) baking off said catalytic layer and said non-conformal layer of lacquer such that said aluminum layer is left with a planar topography, said baking off of said catalytic layer occurring at a temperature which does not adversely affect components of said flat panel display structure.

2. The method as recited in claim 1 wherein step a) comprises depositing a non-conformal layer of acrylic containing lacquer.

3. The method as recited in claim 1 wherein step b) comprises depositing said catalytic layer to a depth of 5 to 40 angstroms.

4. The method as recited in claim 1 wherein said catalytic layer in step b) is comprised of a material selected from the group consisting of Platinum, Palladium, Rhodium and Ruthenium.

5. The method as recited in claim 1 wherein step b) comprises depositing said catalytic layer by physical vapor deposition directly onto said non-conformal layer of lacquer.

6. The method as recited in claim 1 wherein step c) comprises depositing said aluminum layer to a depth of 300 to 800 angstroms.

7. The method as recited in claim 1 wherein step c) comprises depositing said aluminum layer by physical vapor deposition.

8. The method as recited in claim 1 wherein said temperature in step d) does not adversely affect said black matrix.

9. The method as recited in claim 1 wherein said temperature in step d) does not adversely affect reflectivity of said aluminum layer.

10. The method as recited in claim 1 wherein said temperature in step d) does not induce oxidation of said phosphors.

11. The method as recited in claim 1 wherein step d) comprises baking off said catalytic layer and said non-conformal layer of lacquer at a temperature not higher than approximately 380 degrees Celsius.

12. A method for fabricating a substantially planar aluminum layer in a flat panel display structure having a raised black matrix defining a plurality of wells, said method comprising the steps of:

a) applying phosphors into said wells of said raised black matrix of said flat panel display structure;

b) depositing a non-conformal layer of lacquer over said phosphors;

c) depositing a catalytic layer over said non-conformal layer of lacquer;

d) depositing an aluminum layer over said catalytic layer, said black matrix formed having a height such that a top surface of said black matrix extends above the top surface of said aluminum layer; and e) baking off said catalytic layer and said non-conformal layer of lacquer such that said aluminum layer is left with a planar topography, said baking off of said catalytic layer occurring at a temperature which does not adversely affect components of said flat panel display structure.

13. The method as recited in claim 12 wherein step b) comprises depositing a non-conformal layer of acrylic containing lacquer.

14. The method as recited in claim 12 wherein step c) comprises depositing said catalytic layer to a depth of 5 to 40 angstroms.

15. The method as recited in claim 12 wherein step c) comprises depositing said catalytic layer by physical vapor deposition directly onto said non-conformal layer of lacquer.

16. The method as recited in claim 12 wherein said catalytic layer in step c) is comprised of a material selected from the group consisting of Platinum, Palladium, Rhodium and Ruthenium.

17. The method as recited in claim 12 wherein step d) comprises depositing said aluminum layer to a depth of 300 to 800 angstroms.

18. The method as recited in claim 12 wherein step d) comprises depositing said aluminum layer by physical vapor deposition.

19. The method as recited in claim 12 wherein said temperature in step e) does not adversely affect said black matrix.

20. The method as recited in claim 12 wherein said temperature in step e) does not adversely affect reflectivity of said aluminum layer.

21. The method as recited in claim 12 wherein said temperature in step e) does not induce oxidation of said phosphors.

22. The method as recited in claim 12 wherein step e) comprises baking off said catalytic layer and said non-conformal layer of lacquer at a temperature not higher than about 380 degrees Celsius.

* * * * *